United States Patent [19]

Kubota

[11] Patent Number: 4,779,235
[45] Date of Patent: Oct. 18, 1988

[54] PARALLEL OPERATION OPTICAL PROCESSOR UNIT

[75] Inventor: Keiichi Kubota, Tokyo, Japan
[73] Assignee: NEC Corporation, Tokyo, Japan
[21] Appl. No.: 814,471
[22] Filed: Dec. 30, 1985

[30] Foreign Application Priority Data

Dec. 28, 1984 [JP]   Japan .................................. 59-277480

[51] Int. Cl.[4] ............................................. G11C 8/00
[52] U.S. Cl. ...................................... 365/234; 365/215
[58] Field of Search ............... 365/215, 234, 114, 115, 365/121; 372/8

[56] References Cited

U.S. PATENT DOCUMENTS

| | | | |
|---|---|---|---|
| 3,868,652 | 2/1975 | Cooper et al. | 365/94 |
| 3,902,788 | 9/1975 | Strehlow | 365/121 |
| 4,674,100 | 6/1987 | Kobayashi | 372/8 X |

Primary Examiner—Joseph A. Popek
Attorney, Agent, or Firm—Sughrue, Mion, Zinn, Macpeak, and Seas

[57] ABSTRACT

An optical data processing unit for parallel processing operation is based on one or more successively mutually superimposed optical memory plates and light directing members for controlling the application of input optical data to the memory plates, each memory plate being formed of a planar array of electro-optical memory elements capable of memorizing optical data incident thereon and emitting corresponding optical data thereafter. The memory elements preferably consist of bistable semiconductor laser diodes, enabling an extremely high speed of data processing and logic function switching to be achieved.

5 Claims, 6 Drawing Sheets

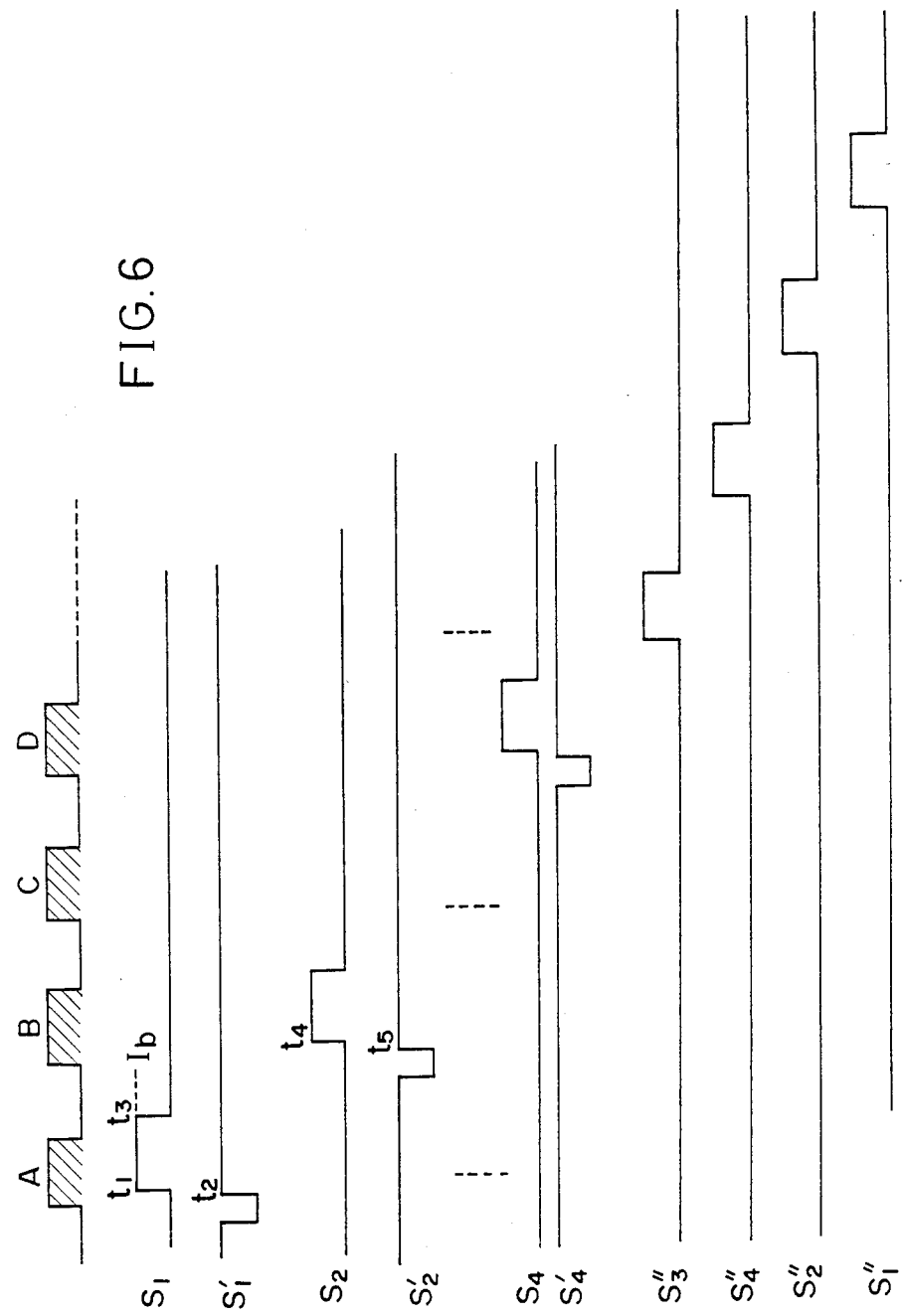

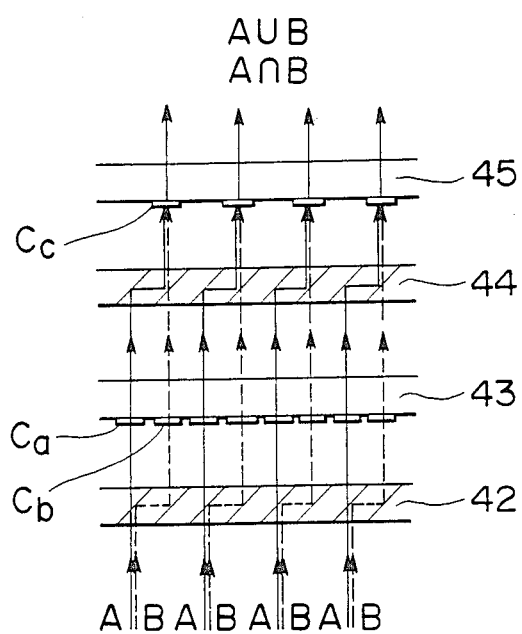

PARALLEL OPERATION OPTICAL PROCESSOR UNIT

BACKGROUND OF THE INVENTION

The present invention relates to an optical processing unit for parallel operation, which incorporates an optical memory function. In the prior art, optical methods of data processing have been mainly utilized for filtering processing, such as image enhancement, noise elimination, etc, or for correlation processing based on matched filters. Such processing takes a substantial amount of time to perform, if electronic signal processing means are employed. However optical processing using a single lens and the Fourier transform can be employed to perform such processing by parallel two-dimensional operation at the speed of light. There have also been proposals for employing two-dimensional parallel optical processing to perform computation which has hitherto been performed by electronic means. For example, by using an array of LEDs, a matrix mask and an array of photodectors, it is possible to carry out matrix computations by optical processing. Such matrix computation by optical means has been described in detail in an article entitled "Microprocessor-Based Fiber Optic Iterative Processor" which appeard on pages 147 to 152 of the journal "Applied Optics", of January 1982. As descried in this article, matrix compuation is performed utilizing a linear array of LEDs, a planar spatial modulator (for example a hologram), and a linea array of photo-detectors. With that method, matrix multiplication processing is performed optically by two-dimensional parallel processing, and so can be carried out at very high speed. However, no optical memory means is incorporated, so that it is necessary to store intermediate results of the iterative processing in some form of electrical memory in order to enable successively generated intermedaite results to be compared with one another. In addition, due to the fact that optical processing and electrical processing are directly combined, it is necessary to provide elements for performing conversion from optical to electrical signals, and vice-versa. Due to the time necessary to perform these conversion operations, the speed of processing is substantially lower than that which is possible if purely optical processing is carried out.

It has also been proposed to employ an optical logic element made up of an optical gate array, i.e. a planar array of optical gate elements. Details of such optical logic elements are given in an article entitled "Digital Optical Computing" apearing in the Proceedings of the IEEE, in July 1984 (pages 758 to 779). The article describes how it is possible to form an optical logic system for sequential processing by employing a planar array of optical gate elements and a planar optical interconnection unit. The proposed arrangement is illustrated in FIG. 1 of the drawings, and is made up of an optical gate element array 14 and a reconfigurable optical interconnection unit 15. The optical gate element array 14 can be considered to consist of three sections, i.e. an input/output section 11, in central processing unti (CPU) 12, and a memory section 13. The I/O section 11 employs light valves for input and output of data. I/O section 11, CPU 12 and memory section 13, are mutually interconnected in an arbitrarily selectable arrangement, through the reconfigurable optical interconnection unit 15, by light beams 16. In addition, the optical gate elements in CPU 12 can access any arbitrarily selectable optical gate element of I/O unit 11 or memory section 13. In this way, a non Von Neumann type of processor can be implemented by optical means. If the optical gate elements are utilized and NAND gates, then a general sequential type of flip-flop circuit can be configured with this sytem. Utilizing liquid crystal light valves for the optical gate element array 14, and a computer-generated hologram for interconnection unit 15, a practical system having this configuration was set up and tested, as described in the above article. Since the optical gate elements are connected by loops, formed of light beams, it is possible to define any desired logic function by employing an appropriate combination of interconnections and gate elements. However, in order to implement a wide range of processing capabilities it is necessary for the optical interconnection unti to be capable of changing the interconnections formed thereby at very high speed, to thereby successively implement different logic functions. In practice it is extremely difficult to attain a sufficiently high speed of interconnection switching, i.e. to employ elements which will perform such switching at a speed which will be compatible with the operating speed capabilities of optical processing. This is a basic disadvantage of such an optical logic system.

SUMMARY OF THE INVENTION

It is an objective of the present invention to overcome the problems of the prior art as described above, and to provide an optical data processing unit which will enable parallel optical data processing to be carried out at high speed.

An optical data processing unit according to the present invention essentially comprises one or more optical memory plates, each comprising a planar array of electro-optical memory elements which can be selectively set, under the control of electrical drive signals applied thereto, into a first state in which input light data is memorized thereby, e.g. which will respond to input light of sufficient intensity incident thereon by entering a light-emitting state, and will maintain this light-emitting state following cessation of the input light, and a second state in which such memorized data is erased and no emission of light in response to input light incident thereon will occur. Such an optical data processing unit may further include optical directing devices for directing input data light onto specific ones of the planar array of electro-optical memory elements of an optical memory plate, and may also include optical directing devices for directing output light (emitted as a result of data processing) from the planar array of memory elements of an optical memory plate to external apparatus in a desired manner. The optical directing devices can consist of, for example, lenses, optical gratings, arrays of optical fibers, holograms, electrically-controllable optical switching matrices, optical spatial modulators, etc. An optical data processing unit according to the present invention further comprises one or more drive circuits for generating electrical signals to control the operation of the optical memory elements, for thereby controlling the processing functions of the unit, and also (if the optical directing device should include electrically controllable means such as optical switching matrices) for controlling the operation of the light directing device to further control the processing functions executed by the unit.

In general, an optical data processing unit according to the present invention will consist of a combination of a number of successively superimposed optical directing devices and optical memory plates, as required by the processing functions which must be executed, as will be made clear hereinafter from the descriptions of the preferred embodiments.

With a parallel optical data processing unit according to the present invention, input data light is directed to fall upon specific memory elements of an optical memory plate. The data represented by the light thus incident on these memory elements can then be temporarily stored thereby, as a parallel data array, and this stored data can then be compared or otherwise processed with respect to a subsequent input data array. In this way, data processing such as iterative computations or pattern comparison can be carried out through parallel planar operation, at extremely high speed, without the need to perform intermediate storage of data within an electrical memory unit and to carry out the associated opto-electric and electro-optic conversion processing necessitated by such storage.

BRIEF DESCRIPTION OF THE DRAWINGS

FIG. 6 is a timing chart for assistance in describing the operation of the embodiment of FIG. 5, and;

FIG. 7 and FIG. 8 show a second embodiment of the present invention.

DESCRIPTION OF THE PREFERRED EMBODIMENTS

Figure 1:
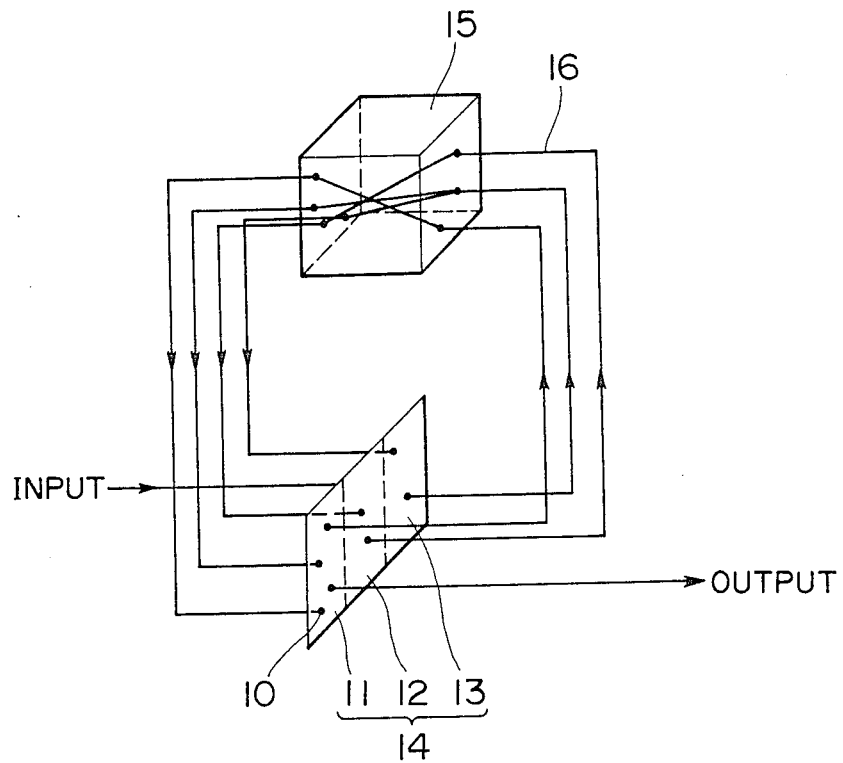
FIG. 1 shows an example of a prior art proposal for an optical data processing system.
Figure 2:
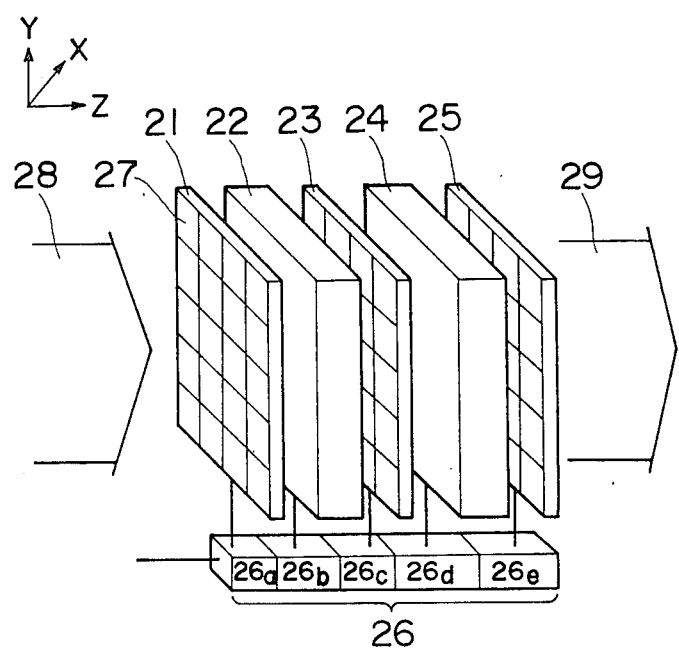
FIG. 2 and FIG. 4 are diagrams for illustrating the basic principles of operation of an optical data processing unit according to the present invention.

FIG. 2 is a diagram for illustrating the basic principles of an example of a parallel optical data processing unit according to the present invention. This consists of optical memory plates 21, 23 and 25, and optical directing devices 22 and 24, which are successively superimposed as shown, i.e. with optical directing device 22 being disposed between optical memory plates 21 and 23 and with optical directing device 24 being disposed between optical memory plates 23 and 25.

The optical memory plates 21, 23 and 25 and optical directing devices 22 and 24 are respectively electrically connected to an access control circuit 26, which generates drive signals of suitable amplitude and timing to control the operation of the memory elements of optical memory plates 21, 23 and 25, and the optical directing devices 22 and 24 (assuming that the latter are of electrically controllable type, rather than passive elements such as lenses or diffraction gratings). Each of the optical memory plates 21, 23 and 25 consists of a planar array of optical memory elements 27, which preferably consist of light-emitting electro-optical elements having a bistable characteristic, such as bistable semiconductor laser diodes. Each of electro-optical elements 27 undergoes a change in the light emission characteristics thereof in response to a level of light incident thereon and in response to electrical drive signals applied thereto, as described in detail hereinafter. Briefly, an electrical signal from a corresponding section of access circuit 26 (i.e. sections 26a, 26c and 26e for the electro-optical elements of memory plates 21, 23 and 25 respectively) is applied to specific ones of the electro-optical elements 27 in an optical memory plate, which respond to this signal by being reset to an initial operating state, e.g. a state in which no light is emitted therefrom. Subsequent illumination of these electro-optical elements 27 by light of sufficient intensity, after establishment of this initial state, will result in the illuminated electro-optical elements 27 being set in a condition, referred to in the following as the ON state, in which light is thereafter continuously emitted therefrom, in the opposite direction to that of the incident light. This emission of light from the electro-optical elements thus triggered into the ON state will continue until a reset signal is applied, i.e. an electrical signal is applied thereto, restoring the electro-optical elements to the initial state described above.

Numeral 28 denotes input data light, which is caused to fall upon optical memory plate 21 after an electrical signal from section 26a of access circuit 26 has reset specific electro-optical elements 27 of optical memory plate 21 in the initial state described above. Data contained in input light 28 is thereby stored by these electro-optical elements 27 of optical memory plate 21, i.e. is stored as a planar matrix array.

Figure 3A:
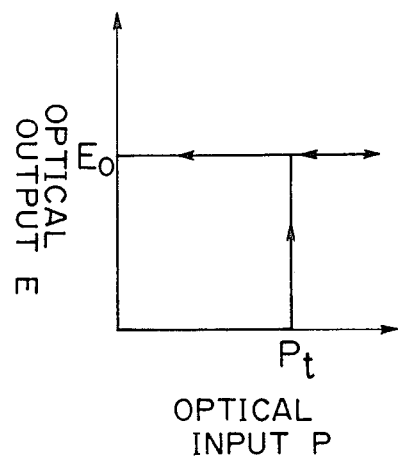
FIG. 3(a) and FIG. 3(b) show the operating characteristics of a bistable semiconductor laser element suitable for use as an electro-optical memory element in an optical data processing unit according to the present invention, measured with respect to an input light level and an electrical drive signal level, respectively.
Figure 3B:
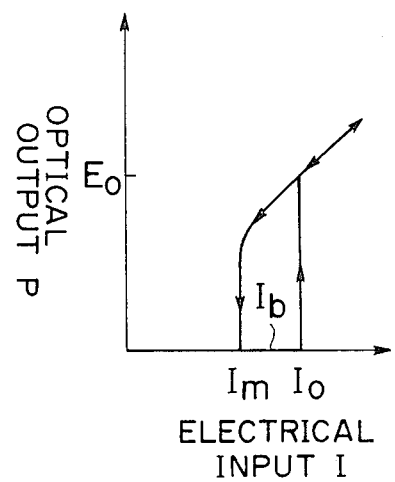

The electro-optical elements 27 of an optical data processing unit according to the present invention are preferably formed of bistable semiconductor laser diodes. The operating characteristics of such an element are illustrated in FIG. 3(a) and FIG. 3(b), in which FIG. 3(a) shows optical input/output characteristic, i.e. the relationship between the intensity of incident light falling upon the bistable semiconductor laser diode and light emission from the diode, while FIG. 3(b) shows the electrical characteristic, i.e. the relationship between the level of an electrical signal applied to the laser diode and the light emission therefrom. As shown in FIG. 3(a), assuming that a level of electrical drive signal applied to the laser diode is within a specific range (as described hereinafter), with the laser diode operating in an initial state in which no light is emitted therefrom, and the level of input light applied to the laser diode being successively increased from zero, then when the intensity P of the input light exceeds a certain threshold value Pt, the laser diode is triggered into a light-emitting state (the ON state), with the light emitted therefrom very rapidly rising to a level $E_0$. This level of light output $E_0$ is maintained constant thereafter, even if the level of input light falls substantially below the threshold level Pt, i.e. the laser diode has a bistable characteristic with respect to incident light, when operated with an appropriate level of drive current. Referring now to the electrical characteristic of FIG. 3(b), assuming that the laser diode is in the initial, non-emitting state and that the level I of an electrical drive signal (i.e. the injection current supplied to the laser diode) is successively increased from zero, then when this drive signal level exceeds a value $I_0$, light emission by the laser diode is triggered, with the level of emitted light rapidly rising to a value $E_0$. If the level of the electrical drive signal is then successively reduced, the output light level from the laser diode will be substantially maintained until it suddenly falls to zero when the electrical drive signal level falls below a value $I_m$.

Thus, the electrical characteristic is also bistable. The laser diode is reset to the non-emitting (initial) state when the electrical drive signal falls below level $I_m$, and is triggered to the light-emitting (ON) state when the electrical drive signal rises above the level $I_0$, with the resetting and triggering process in each case being independent of the level of input light applied to the laser element. However if the electrical drive signal level is fixed at a value intermediate between $I_m$ and $I_0$, i.e. the value $I_b$ shown in FIG. 3(b), then the diode will be triggered from the non-emitting to the emitting state by an input light level exceeding the value $P_t$, as described above.

It can thus be understood that if the electrical drive signal level is first reduced to zero, to reset the laser diode to the initial, non-emitting state, and then is set at the value $I_b$, then a subsequent input of light to the laser diode which exceeds the value $P_t$ will trigger the laser diode to the ON state, i.e. the data represented by that optical input will be memorized by the laser diode. In this way, such a bistable semiconductor laser diode can be utilized effectively as an optical memory element, since the resetting and triggering operations can be accomplished at extremely high speeds.

In practice, the optical threshold level $P_t$ varies in accordance with the electrical bias signal level $I_b$. This fact makes it possible to electrically control a logic function performed by such a bistable laser diode. That is to say, it is possible to arrange that input data light exceeding a certain intensity (definable as the "1" logic level) from a single input source will trigger the laser diode into the light-emitting state, in which case an OR logic function is implemented. Conversely, if it is arranged that input data light levels from two separate sources (each corresponding to a "1" logic level) is necessary to trigger a laser diode into the light-emitting state, then a two-input AND function is realized. Thus by employing planar arrays of such diodes as is disclosed with the present invention, it is possible to selectively switch between different logic functions at extremely high speed, during a parallel processing operation.

A description of bistable laser diodes which are applicable to the present invention is given in a paper entitled "An Experiment on Optical Time-Division Digital Switching Using Bistable Laser Diodes and Optical Switches", given at the IEEE Global Telecommunications Conference, in November 1984.

Referring again to FIG. 2, the data which is stored in this way in optical memory plate 21 is output therefrom as light which is emitted from specific ones of the electro-optical memory elements 27 of optical memory plate 21, with this light being emitted from the opposite side of optical memory plate 21 to that on which the input light is incident, i.e. the output light is directed upon optical directing device 22. This data light which is incident on optical directing device 22 is spatially displaced thereby in a specific pattern, to be directed onto appropriate electro-optical memory elements of optical memory plate 23. In this example, the pattern of this displacement by optical directing device 22 is controlled by electrical signals applied thereto from section 26b of access circuit 26. The data light which is thus input to optical memory plate 23 is then stored thereby, in response to electrical signals from access circuit section 26c, in the same way as described above for optical memory plate 21. The stored data light is thereby emitted from optical memory plate 21 towards optical directing device 24, and similar processing of the data light is then performed by optical directing device 24 and optical memory plate 25. The resultant output data light from the above series of processing steps is emitted from optical memory plate 25, as indicated by reference numeral 29.

Synchronization of the triggering and rest operations of the optical memory plates of the embodiment of FIG. 3, i.e. with respect to the timings at which input data light 28 is applied, can be accomplished by utilizing a clock signal of fixed frequency to control the operation of access circuit 26. In this way, various types of data processing functions can be performed, e.g. by causing stored data light and newly input data light to be simultaneously incident upon electro-optical memory elements of an optical memory plate, as described in detail hereinafter.

The optical directing devices 22 and 24 have the function of displacing directing the data light which is incident thereon such as to fall upon specific ones of the memory elements of optical memory plates 23 and 25 respectively, and can consist of lenses, arrays of optical fibers, hologram elements, optical switching matrices, optical spatial modulator elements, planar electro-optical integrated circuits, etc.

Figure 4:
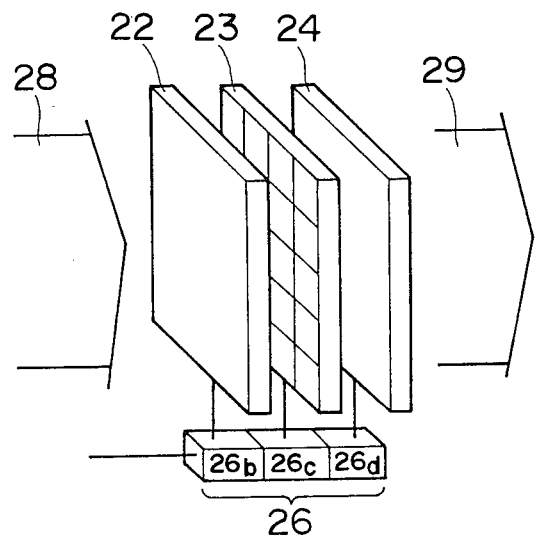

FIG. 4 is a diagram to illustrate the basic principles of another embodiment of the present invention. In this case, only part of the optical memory plates and optical directing devices of the embodiment of FIG. 2 are utilized. Designating as T the period of the clock signal which controls the operation of access circuit 26b, and hence the timing of operations by optical memory plate 23 and optical directing devices 22 and 24, as described above, and designating the number of the array of electro-optical memory elements of optical memory plate 23 as N×N, then the rate P at which data can be processed is given as:

$$P = N^2/T \text{ (bits/second)}$$

Assuming that N=100 and T=1 ns, then $P=10^{13}$ bits/second. Thus, processing can be carried out at a higher speed than has been possible in the prior art.

An optical data processing unit according to the present invention is based upon a combination of an optical memory plate with optical directing devices, and a plurality of optical processing functions can be implemented by arrays of such optical data processing units. Use of optical data processing units according to the present invention renders it unnecessary to execute high speed alteration of optical interconnections by means external to the processing unit, such as is necessary with the prior art examples described above, and high-speed data processing can be performed through real-time alteration of optical interconnections to select desired processing functions during operation.

Figure 5:
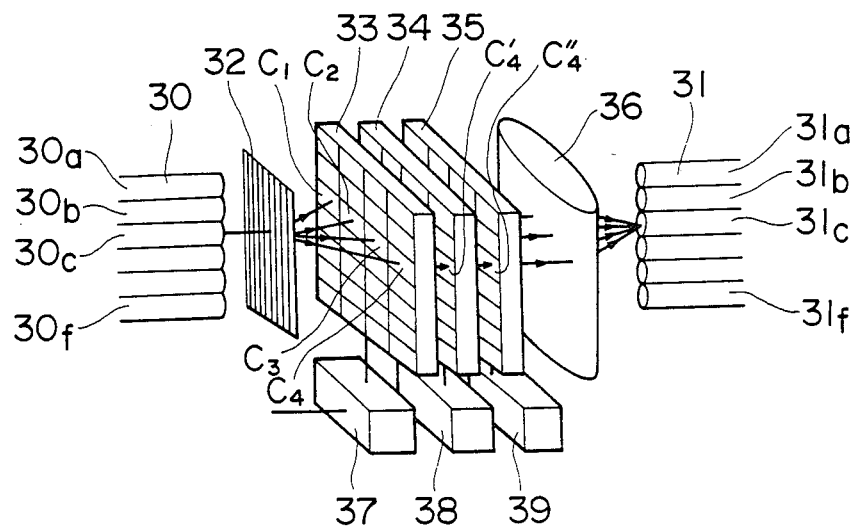
FIG. 5 shows a first embodiment of the present invention.

Referring now to FIG. 5, a first embodiment of a parallel optical data processing unit according to the present invention is shown, whose basic principles are as described hereinabove with reference to FIG. 2. The embodiment includes optical directing devices 32 and 36, consisting of an optical grating and a cylindrical lens respectively, and optical memory plates 33, 34 and 35. Time serial data, in the form of light, is transferred through a linear array of optical fibers 30, and falls upon a optical grating 32 as shown. Taking for example one of the linear array of optical fibers 30, e.g. optical fiber 30c, time serial data in the form of modulated light representing a succession of binary bits, four successive ones of which will be designated as A, B, C, D, is transferred through optical fiber 30c, with each data bit having either a "1" or "0" logic state, as indicated in the timing diagram of FIG. 6 which illustrates the operation of this embodiment. In FIG. 6, $S_1$ to $S_4$ denote drive signals applied from access circuit 37 to laser diode elements C1 to C4, respectively, $S_1'$ to $S_4'$ denote drive signals applied from access circuit 38 to laser diode elements C1' to C4' respectively, and $S_1''$ to $S_4''$ designate drive signals applied from access circuit 39 to laser diode elements C1'' to C4'' respectively. The light emitted from optical fiber 30c is diffracted by diffraction grating 32 to diverge in the X-direction as seen in FIG. 5, to thereby fall simultaneously upon each of a row of electro-optical memory elements C1, C2, C3 and C4 of optical memory plate 33. The drive signals from access circuit 37 control the operation of memory elements C1, C2, C3 and C4, as described hereinabove, such that the serial data bits A, B, C and D carried by the input light are successively stored in electro-optical memory elements C1, C2, C3 and C4 of optical memory plate 33 in synchronism with output of bits A, B, C and D from optical fiber 30c. That is to say, at a first timing point $t_1$, a storage enabling signal ($S_1$) is applied to a bistable semiconductor laser diode constituting electro-optical memory element C1, whereby data bit A is stored in C1, e.g. with the "1" or "0" state of that data bit being represented by electro-optical memory element C1 being either set in a state in which light is continuously emitted therefrom towards optical memory plate 34 or left in a state in which no light is emitted therefrom, respectively. It should be understood that the term "applies a storage enabling signal to" has the significance of "applies an electrical drive signal thereto, whose level is initially lower than the threshold level $I_m$ shown in FIG. 3(b) (and described hereinabove) and then is raised to a value in the range between $I_m$ and $I_O$, e.g. $I_b$ and held at that level". At a succeeding time point $t_2$, access circuit 38 sends a storage enabling signal ($S_1'$) to the bistable semiconductor laser diode constituting electro-optical memory element C1' of optical memory plate 34, whereby data bit A is stored therein. At a succeeding time point $t_3$, the bistable semiconductor laser diode constituting electro-optical memory element C1 of optical memory plate 33 is set in an OFF state, i.e. the level of drive signal applied thereto from access circuit 38 is reduced below the level $I_m$ shown in FIG. 3(b), and held at this lower value, to thereby clear the data which was stored in that electro-optical memory element. A storage enabling signal is then applied to electro-optical memory element C2 of optical memory plate 33, at timing $t_4$ whereby the next serial data bit B, which is output from optical fiber 30c at that timing (as a result of appropriate synchronization between the source of the input data and the operation of access circuit 37, the means for such synchronization being omitted for simplicity of description) becomes stored in electro-optical memory element C2. At the next time point $t_5$, a storage enabling signal is applied to electro-optical memory element C2' of optical memory plate 34, whereby data bit B becomes stored therein, and electro-optical memory element C2 of optical memory plate 33 is then set in the OFF state. In this way, the data bits A, B, C, D are successively stored in the bistable semiconductor laser diodes C1', C2', C3', C4' respectively of optical memory plate 34 (i.e. in those electro-optical memory elements which are respectively positioned opposite to the bistable semiconductor laser diodes C1, C2, C3 and C4 of optical memory plate 33). The time sequence of the data bits A, B, C and D can now be changed as desired, e.g. to C, D, B and A. This can be accomplished by first applying a storage enabling signal ($S_3''$) from access circuit 39 to optical memory plate 35 acting to store data bit C in electro-optical memory element C3'', whereby light corresponding to that data bit will be emitted from electro-optical memory element C3'' and focussed by cylindrical lens 36 upon optical fiber 31c of the linear array of optical fibers 31. Optical memory element C3'' is then set to the OFF state, and a storage enabling signal is applied to electro-optical memory element C4'', to thereby store data bit D therein and so transfer the light corresponding to this data to optical fiber 31c, whereupon electro-optical memory element C4'' is then set to the OFF state. The same procedure is successively repeated for the bistable semiconductor laser diodes C2'' and C1''. In this way the data bits C, D, B and A are output in time serial form, in that order, through optical fiber 31c.

In parallel with the serial sequence conversion operations described above, similar sequence conversion operations can be performed on the serial data which is input from optical fibers 30a, 30b, . . . 30f and is input from optical fibers 30a, 30b, . . . 31f. That is to say, parallel two-dimensional optical processing is continuously performed by this embodiment, so that time serial sequence conversion can be accomplished at extremely high speed.

Figure 7:
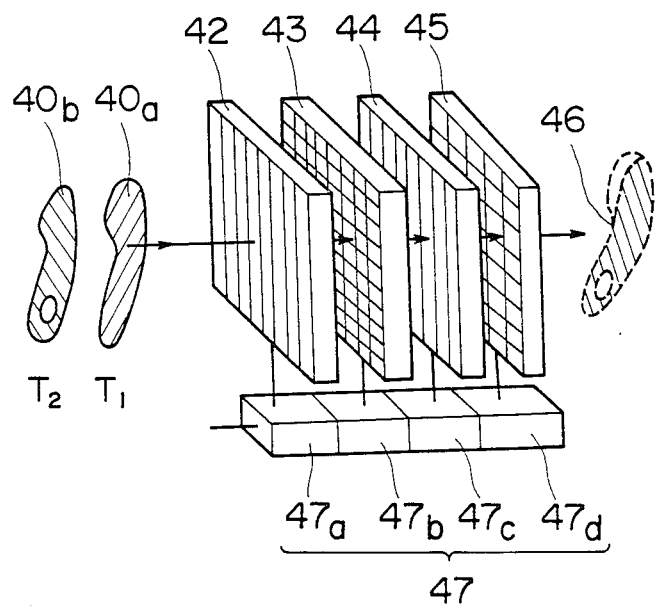

FIG. 7 shows a second embodiment of the present invention, which is a parallel optical data processing unit for performing image processing. The unit serves to produce a processed image 46 from a pair of images 40a and 40b, which are input thereto at timings $T_1$ and $T_2$ respectively. The parallel optical data processing unit is made up of optical memory plates 43 and 45, and optical directing devices 42 and 44, successively superimposed in the order shown. The operation of this embodiment can be more clearly understood by referring to the partial cross-sectional diagram of FIG. 8. As in the previous embodiment, the electro-optical memory elements of this embodiment consist of bistable semiconductor laser diodes. The image data 40a, whose light is designated by the letter A in FIG. 8, is first input to optical directing device 42, and is transmitted directly therethrough as shown, to fall upon optical memory plate 43 and stored in a set of electro-optical memory elements Ca of optical memory plate 43 in response to a storage enabling signal applied to electro-optical memory elements Ca from a circuit section 47b of access circuit 47. Image 40b is then input, at time $T_2$, and the corresponding light (designated as B in FIG. 8) is laterally displaced by optical directing device 42 in response to drive signals applied thereto from a circuit section 47a of access circuit 47. Due to this lateral displacement, light B emerges from optical directing device 42 as shown by the broken line portions in FIG. 8, to fall upon a second set of electro-optical memory elements Cb of optical memory plate 43. This data light is then stored in electro-optical memory elements Cb in response to a storage enabling signal applied thereto from access circuit section 47b. Data representing images 40a and 40b is now stored in the sets of electro-optical memory elements Ca and Cb respectively, with corresponding light being emitted simultaneously from these electro-optical memory elements directed towards optical directing device 44. At this time, drive signals are applied to optical directing device 44 from drive circuit section 47c which cause optical directing device 44 to transmit light output B from optical memory plate 43 directly onto a set of electro-optical memory elements Cc of optical memory plate 45, and at the same time to laterally shift the light A which is input thereto from optical memory plate 43, by such an amount that light A is also directed to fall upon electro-optical memory elements Cc of optical memory plate 45. That is to say, the images 40a and 40b shown in FIG. 7 are now mutually superimposed upon optical memory plate 45. When a storage enabling signal is now applied to electro-optical memory elements Cc of optical memory plate 45, light data will be stored in electro-optical memory elements Cc and hence emitted therefrom, as indicated by numeral 46, which corresponds to the logic sum or logic product of the two sets of image data 40a and 40b.

Specifically, if the operating conditions of each of electro-optical memory elements Cc of optical memory plate 45 are established (as determined by the levels of drive signal applied thereto from drive circuit 47d, for example) such that light representing a "1" logic level of either one of the two sets of data light incident thereon (i.e. A and B) is of sufficient intensity to trigger that electro-optical memory element Cc to the ON (light-emitting) state, i.e. if that light intensity exceeds the threshold level $P_t$ shown in FIG. 3(a), then a logic OR function will be performed by each of electro-optical memory elements Cc. Hence, the data constituting output image 46 from optical memory plate 45 will be the logical sum of the input image data 40a and 40b. If on the other hand the operating conditions of electro-optical memory elements Cc are set such that light representing the "1" logic level of either one of the data light sets A and B is insufficient by itself to trigger an electro-optical memory element Cc to the ON state, but the sum of the intensities of simultaneously applied light representing the "1" logic level from both of data light sets A and B is sufficient to produce triggering of electro-optical memory element Cc to the ON state, then each electro-optical memory element Cc will perform an AND function. That is to say, the output image data 46 will represent the logical product of the input images 40 and 40b. In this way, either AND or OR logical processing of images can be performed by this embodiment, as desired.

Such alteration of the logic functions performed by the memory elements can be carried out by varying the level of the electrical bias signal applied to each memory element when it is set in the "storage enabled" state, as described hereinabove with reference to Figs. 3(a) and 3(b), to thereby vary the optical threshold level for triggering the memory elements into the light-emitting state. In this way, switching between AND or OR logic functions can be executed at extremely high speed, during parallel processing operation.

It should be noted that it would be equally possible to execute such a conversion between AND and OR logical processing by providing a device, for example disposed between plates 44 and 45 in the embodiment of FIG. 7, whose light transmission properties can be modified by application of electrical signals thereto. However such logic level conversion could not be executed at very high speed, if devices such as liquid crystal panels are employed to perform the above light transmission control function.

Although the term "processing unit" has been employed in referring to the optical processing devices of the present invention, it should be understood that these can be interconnected in various combinations to implement various combinations of logic functions, i.e. can be employed as parallel processing elements within a system.

Although the present invention has been described in the above with reference to specific embodiments, it should be noted that various changes and modifications to the embodiments may be envisaged, which fall within the scope claimed for the invention as set out in the appended claims. The above specification should therefore be intepreted in a descriptive and not in a limiting sense.

What is claimed is:

1. A parallel optical data processing unit for converting a time serial sequence of optical input data, said unit comprising:
   a first light directing device for directing incoming optical input data;
   first, second, and third optical memory plates, each of said plates including a planar array of electro-optical memory elements for storing optical input data incident on a first side of said planar array, in respective ones of said electro-optical memory elements, with optical output data corresponding to said stored data being emitted from a second side of said planar array, said first optical memory plate receiving said optical input data from said first light directing device, and said second and third optical memory plates storing respective outputs of said first and second optical memory plates;
   access circuit means for applying electrical drive signals to said first, second, and third optical memory plates for selective storing of said optical input data by respective ones of said electro-optical memory elements; and
   a second light directing device for directing an output of said third optical memory plate corresponding to a converted time serial sequence of said optical input data in accordance with operation of said access circuit means.

2. A parallel optical data processing unit according to claim 1, in which each of said electro-optical memory elements comprises a bistable semiconductor laser diode.

3. A parallel optical data processing unit according to claim 1, in which said first light directing device comprises an optical grating, and said second light direction device comprises a lens.

4. A parallel optical data processing unit for performing image processing of optical input data, comprising:
   first and second memory plates, each of which includes a planar array of electro-optical memory elements for storing optical input data incident on a first side of said planar array, in respective ones of said electro-optical memory elements, with optical output data corresponding to the stored data being emitted from a second side of said planar array;
   first light directing means preceding said first optical memory plate, and second light directing means provided between said first and second optical memory plates, each of said first and second light directing means including an electro-optical device responsive to electrical signals applied thereto for shifting a direction of light constituting the optical input data to selectively direct said optical input data upon specific ones of said electro-optical memory elements, and further including circuit means for generating control signals to control said light direction shifting operation by said first and second light directing means; and access circuit means for applying electrical drive signals to said first and second optical memory plates for selective storing of said optical input data by respective ones of said electro-optical memory element.

5. A parallel optical data processing unit according to claim 4, in which each of said electro-optical memory elements comprises a bistable semiconductor laser diode.

* * * * *

UNITED STATES PATENT AND TRADEMARK OFFICE
CERTIFICATE OF CORRECTION

PATENT NO. : 4,779,235

DATED : October 18, 1988

INVENTOR(S) : Keiichi KUBOTA

It is certified that error appears in the above-identified patent and that said Letters Patent is hereby corrected as shown below:

COLUMN 1, LINE 28    Delete "descried" and insert --described--.

COLUMN 1, LINE 31    Delete "linea" and insert --linear--.

COLUMN 1, LINE 38    Delete "intermedaite" and insert --intermediate--.

COLUMN 2, LINE 4     Delete "and" and insert --as--.

COLUMN 2, LINE 16    Delete "unti" and insert --unit--.

COLUMN 9, LINE 44    Delete "40" and insert --40a--.

Signed and Sealed this

First Day of August, 1989

*Attest:*

DONALD J. QUIGG

*Attesting Officer*    Commissioner of Patents and Trademarks